US012751090B2

(12) United States Patent
Kao et al.

(10) Patent No.: US 12,751,090 B2
(45) Date of Patent: Sep. 29, 2026

(54) MODULATION DEVICE

(71) Applicant: Innolux Corporation, Miaoli County (TW)

(72) Inventors: Ker-Yih Kao, Miaoli County (TW); Tong-Jung Wang, Miaoli County (TW); Wen-Chieh Lin, Miaoli County (TW); Ming-Chun Tseng, Miaoli County (TW); Yi-Hung Lin, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 337 days.

(21) Appl. No.: 18/480,511

(22) Filed: Oct. 4, 2023

(65) Prior Publication Data

US 2024/0145461 A1 May 2, 2024

Related U.S. Application Data

(60) Provisional application No. 63/420,689, filed on Oct. 31, 2022.

(30) Foreign Application Priority Data

Jul. 24, 2023 (CN) ........................ 202310910225.X

(51) Int. Cl.
*H10D 89/60* (2025.01)

(52) U.S. Cl.
CPC .................................. *H10D 89/60* (2025.01)

(58) Field of Classification Search
CPC .... H10D 89/60; H10D 89/611; H10D 89/911; H10D 89/921; H10D 89/931
USPC ........................................................... 361/56
See application file for complete search history.

(56) References Cited

U.S. PATENT DOCUMENTS

2013/0154979 A1* 6/2013 Li ........................... G06F 3/044 345/173
2015/0083569 A1* 3/2015 Chang ................... G06F 3/0446 200/600
2019/0189075 A1* 6/2019 Kim .................... G02F 1/13454
2019/0346726 A1* 11/2019 Baba .................. H10D 30/6755

* cited by examiner

*Primary Examiner* — Kevin J Comber
(74) *Attorney, Agent, or Firm* — JCIPRNET

(57) ABSTRACT

A modulation device includes a substrate, an electrostatic discharge protection element, an electronic element, and a driving element. The substrate has an active region. The electrostatic discharge protection element is arranged around the active region. The electronic element is disposed in the active region. The driving element is electrically connected to the electronic element.

11 Claims, 17 Drawing Sheets

MODULATION DEVICE

CROSS-REFERENCE TO RELATED APPLICATION

This application claims the priority benefits of U.S. provisional application Ser. No. 63/420,689, filed on Oct. 31, 2022, and China application serial no. 202310910225.X, filed on Jul. 24, 2023. The entirety of each of the above-mentioned patent applications is hereby incorporated by reference herein and made a part of this specification.

BACKGROUND

Technical Field

The disclosure relates to a modulation device.

Description of Related Art

An electronic element in a modulation device may be damaged by electro static discharge (ESD) during the manufacturing period and even in the subsequent transportation process. Therefore, it is necessary to dispose an electrostatic discharge protection element to reduce the damage to the electronic element caused by the ESD.

SUMMARY

The disclosure provides a modulation device which can reduce the damage to an electronic element caused by electro static discharge (ESD).

In an embodiment of disclosure, a modulation device includes a substrate, an electrostatic discharge protection element, an electronic element, and a driving element. The substrate has an active region. The electrostatic discharge protection element is arranged around the active region. The electronic element is disposed in the active region. The driving element is electrically connected to the electronic element.

In another embodiment of disclosure, a modulation device includes a substrate, an electrostatic discharge protection element, and an electronic element. The substrate has an active region. The electrostatic discharge protection element is disposed on substrate and includes a first conductive layer, a second conductive layer, an insulation layer, and a semiconductor layer. The electronic element is disposed in the active region.

In order to make the above-mentioned features and advantages of the disclosure more comprehensible, the embodiments are provided as below, and the detailed description is as follows with the accompanying drawings.

DESCRIPTION OF THE EMBODIMENTS

Figure 1A:
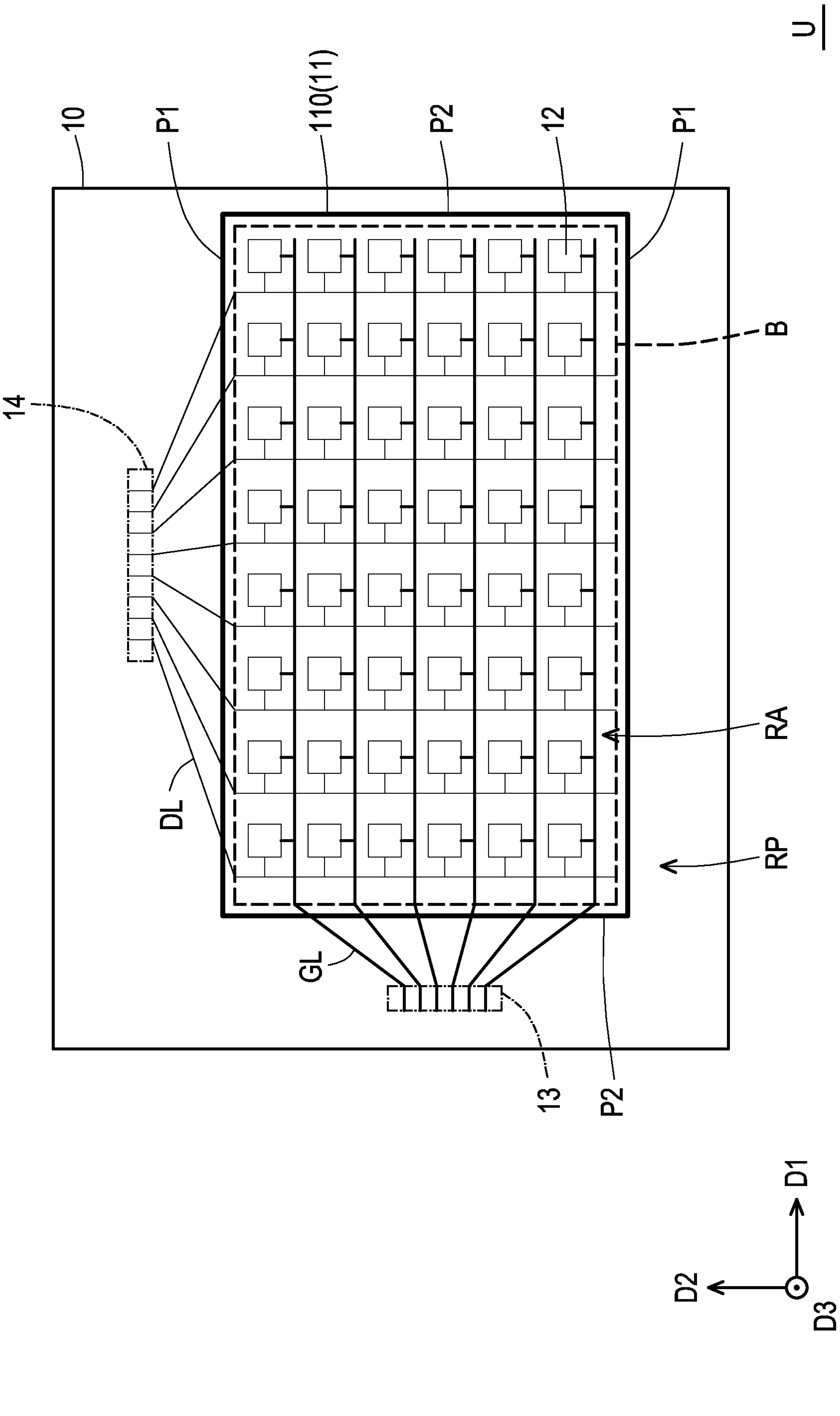
FIG. 1A and FIG. 1B are schematic top views of a modulation device of an embodiment according to the disclosure before and after completion.

Reference will now be made in detail to the exemplary embodiments of the disclosure, examples of which are illustrated in the accompanying drawings. Wherever possible, the same reference numerals are used in the drawings and descriptions to refer to the same or like parts.

Certain terms are used throughout the disclosure and in the appended claims to refer to particular elements. Persons skilled in the art should understand that electronic device manufacturers may refer to the same element by different names. This document does not intend to distinguish between elements that have the same function but have different names. In the following specification and patent application scope, words such as “comprising” and “including” are open-ended words, so they should be interpreted as meaning “including but not limited to . . . ”.

Direction terms mentioned in this article, such as: “up”, “down”, “front”, “rear”, “left”, “right”, are merely referring to the direction of the drawings. Therefore, the direction terms used is for illustration, not for limitation of the disclosure. In the drawings, each drawing illustrates the general characteristics of methods, structures, and/or materials used in the particular embodiment. However, these drawings should not be interpreted as defining or limiting the scope or nature covered by these embodiments. For example, the relative sizes, thicknesses, and positions of layers, regions, and/or structures may be reduced or enlarged for clarity.

A structure (or a layer, an element, a substrate) described in the disclosure positioned on/over another structure (or a layer, an element, a substrate) may mean that the two structures are adjacent and directly connected, or may mean that he two structures are adjacent but not directly connected. Indirect connection means that there is at least one intermediate structure (or an intermediate layer, an intermediate element, an intermediate substrate, an intermediate spacing) between the two structures, a lower surface of one structure is adjacent to or directly connected to an upper surface of the intermediate structure, and an upper surface of another structure is adjacent to or directly connected to a lower surface of the intermediate structure. The intermediate structure may comprise a single-layer or a multi-layer physical structure or non-physical structure, and not limited thereto. In the disclosure, when a structure is disposed “on” other structures, it may mean that the structure is “directly” on other structures, or may mean that the structure is “indirectly” on other structures, that is, at least one structure is sandwiched between the structure and other structures.

The terms “about”, “equal”, “identical” or “the same”, “substantially” or “approximately” are generally interpreted as being within 20% of a given value or range, or as being within 10%, 5%, 3%, 2%, 1%, or 0.5% of a given value or range. In addition, the phrases “the range is from the first value to the second value” and “the range is between the first value to the second value" mean that the range includes the first value, the second value, and other values in between.

The ordinal numbers used in the specification and the appended claims, such as "first", "second", are used to modify elements, which do not imply or represent that the (or these) elements have any previous ordinal numbers, nor do they represent the order of an element with another element, or the order of the manufacturing method, the use of these ordinal numbers is merely used to clearly distinguish an element with a certain designation from another element with the same designation. The same wording may not be used in the scope of the appended claims and in the specification. Accordingly, the first component in the specification may be the second component in the scope of the appended claims.

The electrical connection or coupling described in the disclosure may refer to direct connection or indirect connection. In the case of direct connection, terminals of the elements on two circuits are directly connected or connected to each other by a conductive wire. In the case of indirect connection, there are switches, diodes, capacitors, inductors, resistors, other suitable elements, or a combination of the above elements between the terminals of the elements on the two circuits, but not limited thereto.

In the disclosure, the thickness, length, and width may be measured by adopting an optical microscope (OM), and the thickness or width may be measured by a cross-sectional image of an electron microscope, but not limited thereto. In addition, any two values or directions used for comparison may have certain errors. In addition, the terms "equal to", "identical", "the same", "substantially" or "approximately" mentioned in the disclosure are generally interpreted as being within 10% of a given value or range. In addition, the phrases "the given range is from the first value to the second value", "the given range falls within the range from the first value to the second value" or "the given range is between the first value to the second value" mean that the given ranges include the first value, the second value, and other values in between. If the first direction is perpendicular to the second direction, then the angle between the first direction and the second direction may be from 80 degrees to 100 degrees; if the first direction is parallel to the second direction, then the angle between the first direction and the second direction may be from 0 degrees to 10 degrees.

Unless otherwise defined, all terms (including technical and scientific terms) used herein have the same meaning as commonly understood by persons who have ordinary knowledge in the technical field to which the disclosure belongs. It is understood that these terms, such as those defined in commonly used dictionaries, should be interpreted as having meanings consistent with the background or context of related technologies and the disclosure, and should not be interpreted in an idealized or overly formal manner, unless particularly defined according in the embodiment of the disclosure.

The modulation device of the disclosure may include a communication device, an antenna device, a sensing device, and a light emitting device, but is not limited thereto. The modulation device may include a bendable or flexible device. The antenna device may be, for example, a phase modulation antenna or a liquid crystal antenna, but is not limited thereto. The antenna device may include, for example, an antenna splicing device, but is not limited thereto. It should be noted that the modulation device may be any arrangement and combination of the above-mentioned, but not limited thereto. Additionally, the shape of the modulation device may be a rectangular shape, a circular shape, a polygonal shape, a curved-edge shape, or other suitable shapes. The modulation device may have surrounding systems such as a drive system, a control system, a light source system, but the disclosure is not limited thereto. The sensing device may include a camera, an infrared, or a fingerprint sensor, and the disclosure is not limited thereto. In some embodiments, the sensing device may also include a flashlight, an infrared (IR) light source, other sensors, electronic elements, or a combination thereof, but not limited thereto.

It should be noted that the following embodiments may replace, reorganize, and mix the features of several different embodiments without departing from the spirit of the disclosure to complete other embodiments. As long as the features of each embodiment do not violate the spirit of the disclosure or conflict with each other, they may be mixed and matched arbitrarily.

Figure 1B:
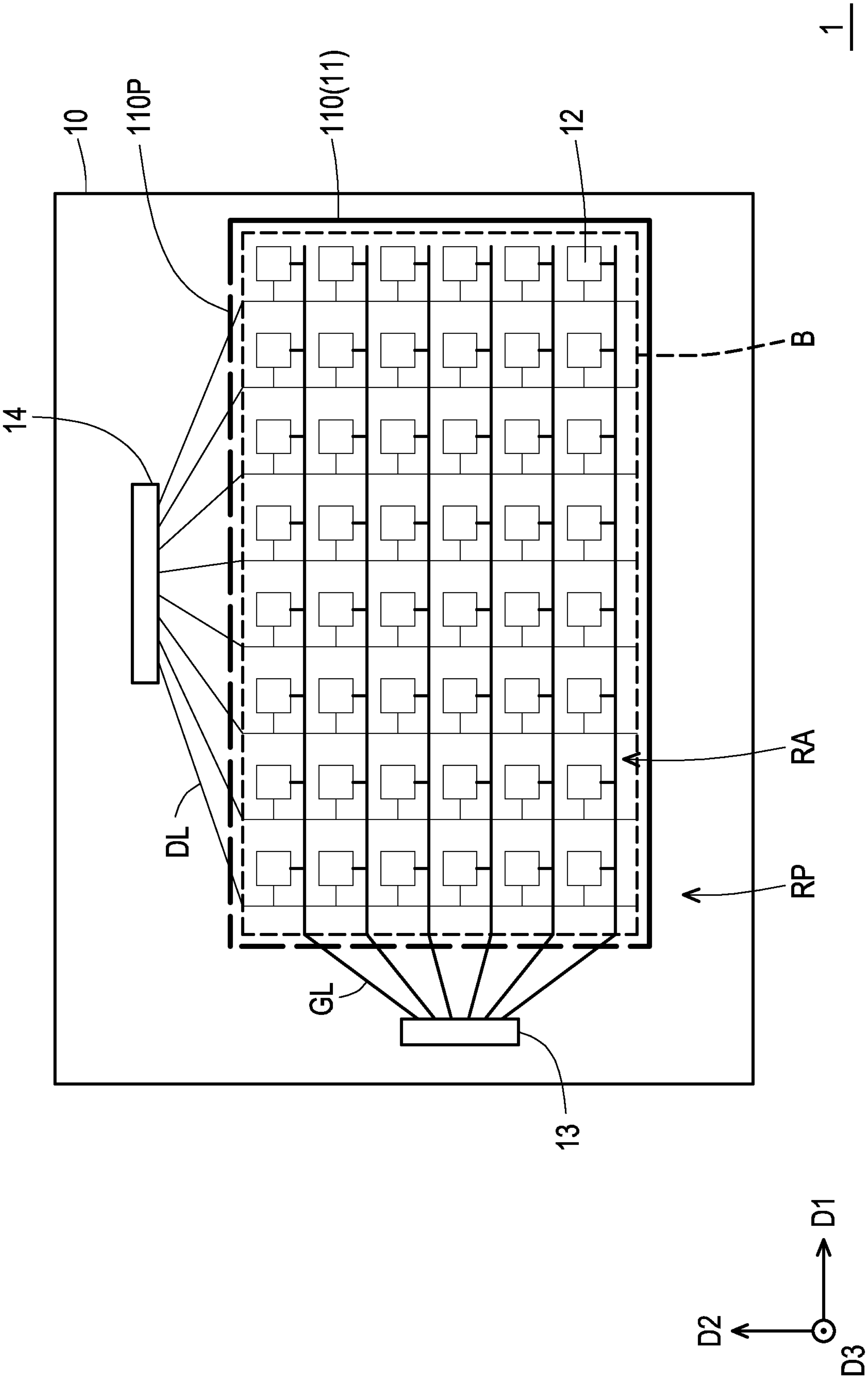
Figure 2:
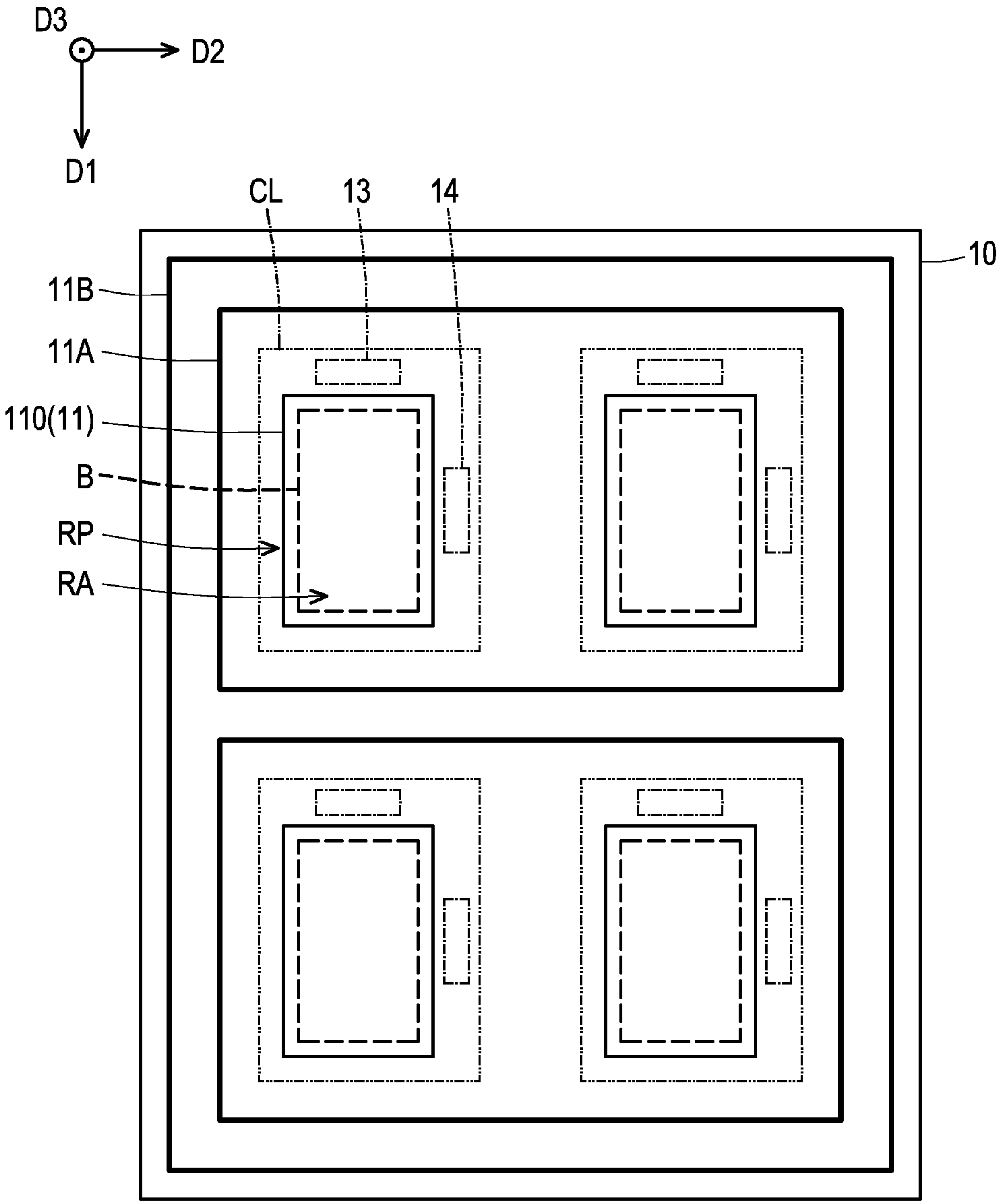
FIG. 2 is a schematic top view showing various disposed positions of an electrostatic discharge protection element.
Figure 11:
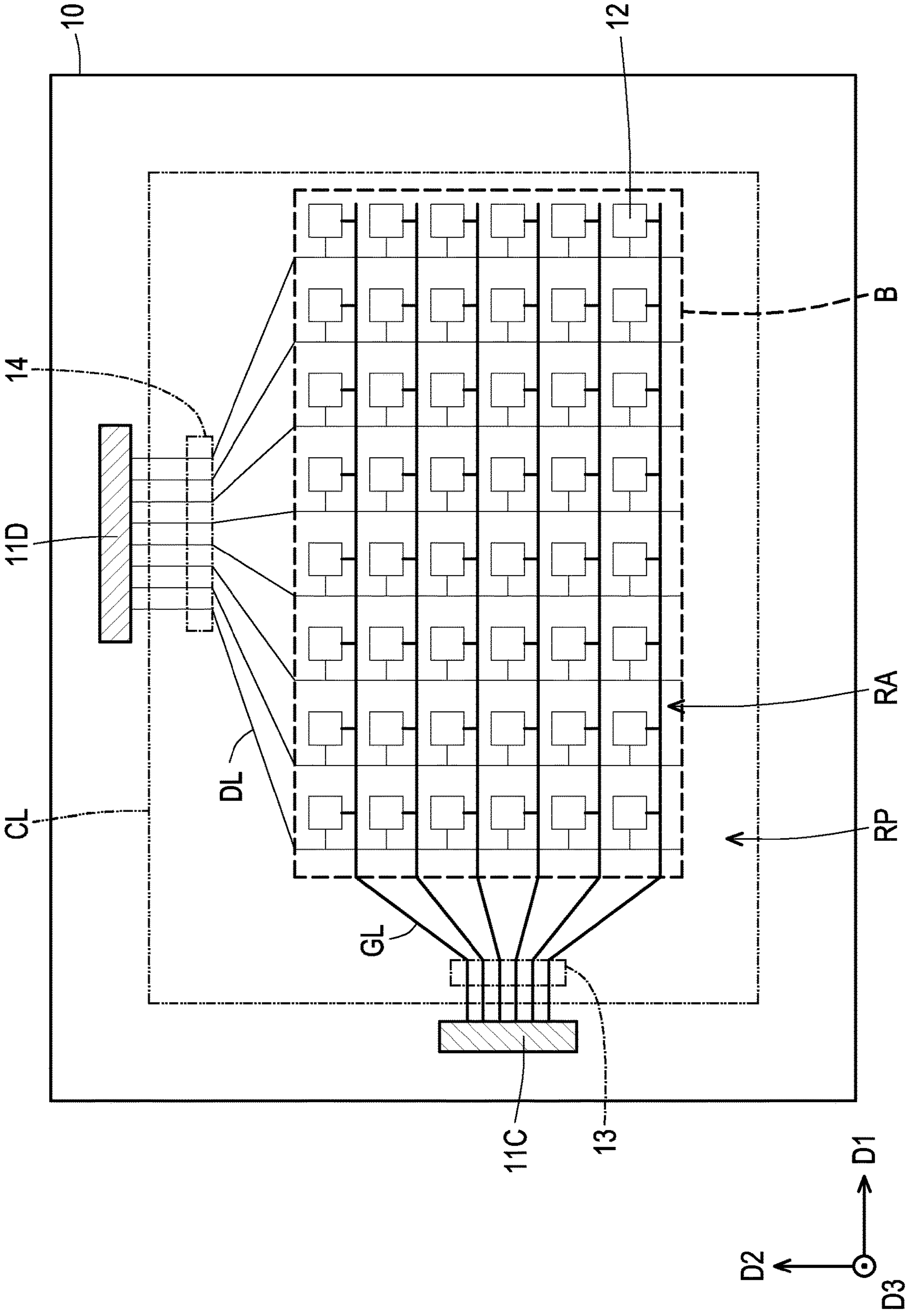
FIG. 11 and FIG. 12 are a plurality of schematic top views, respectively illustrating two relative disposed relationships between the electrostatic discharge protection element and an active region.
Figure 12:
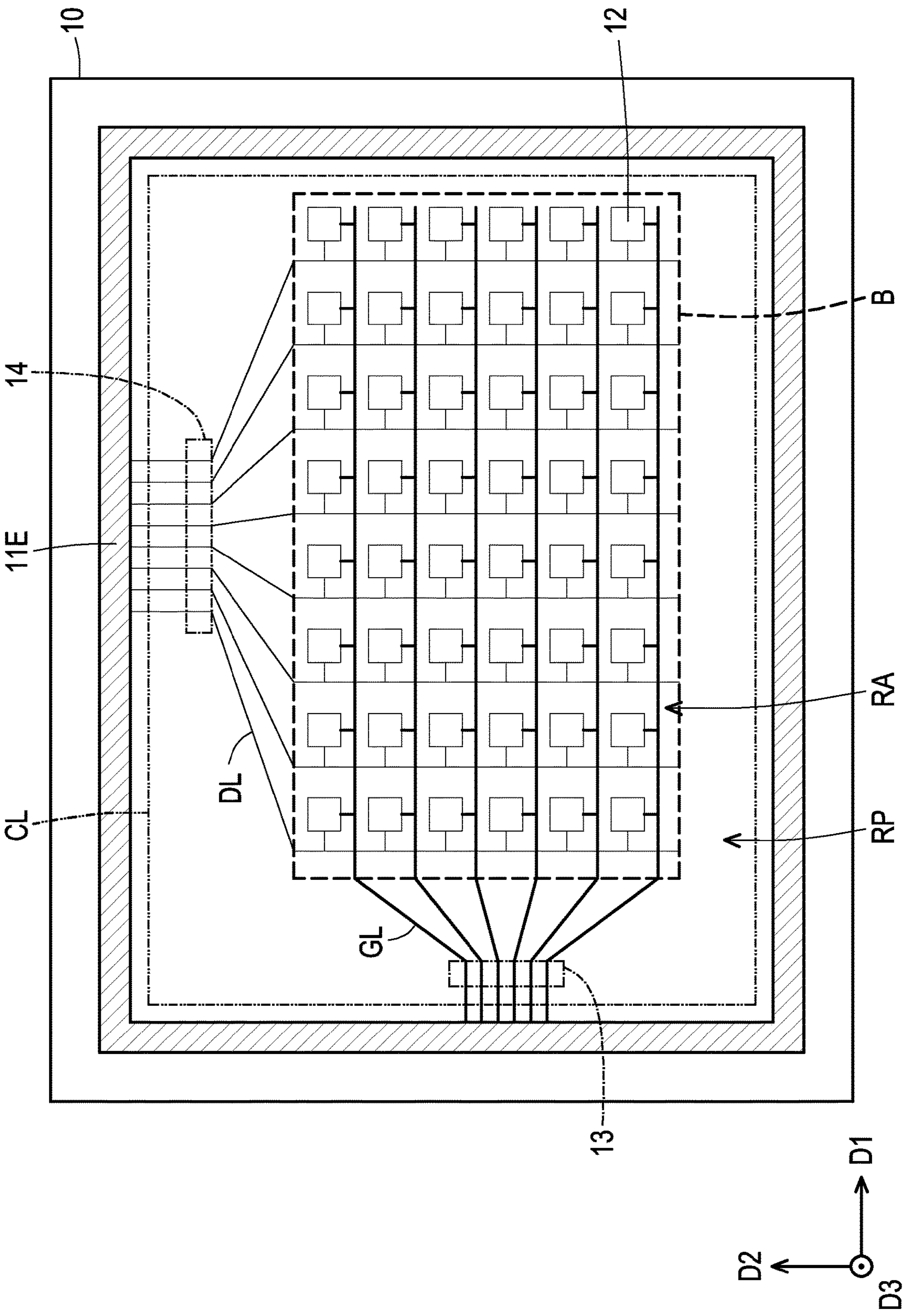
Figure 13:
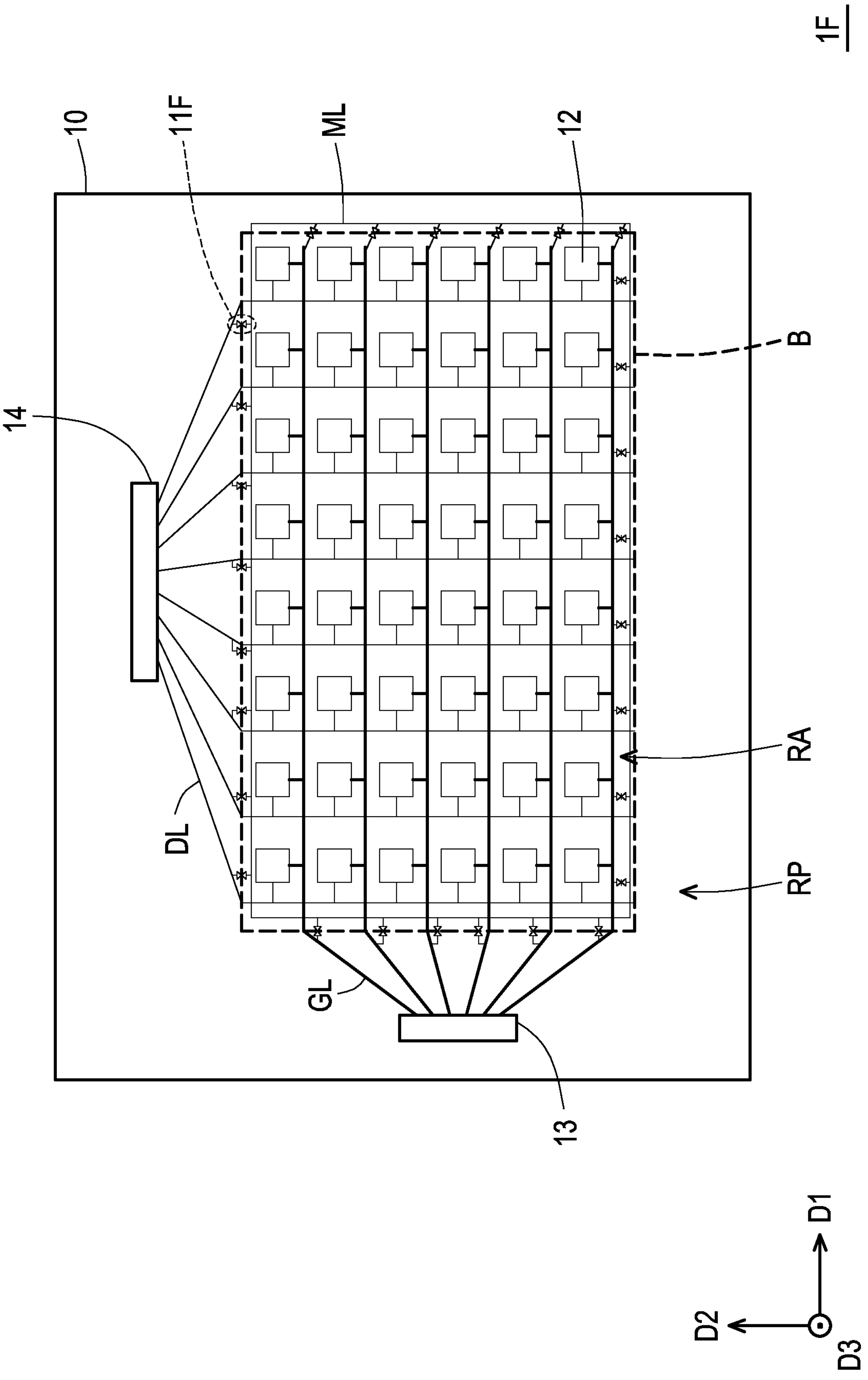
FIG. 13 is a schematic top view of a modulation device according to another embodiment of disclosure.
Figure 14:
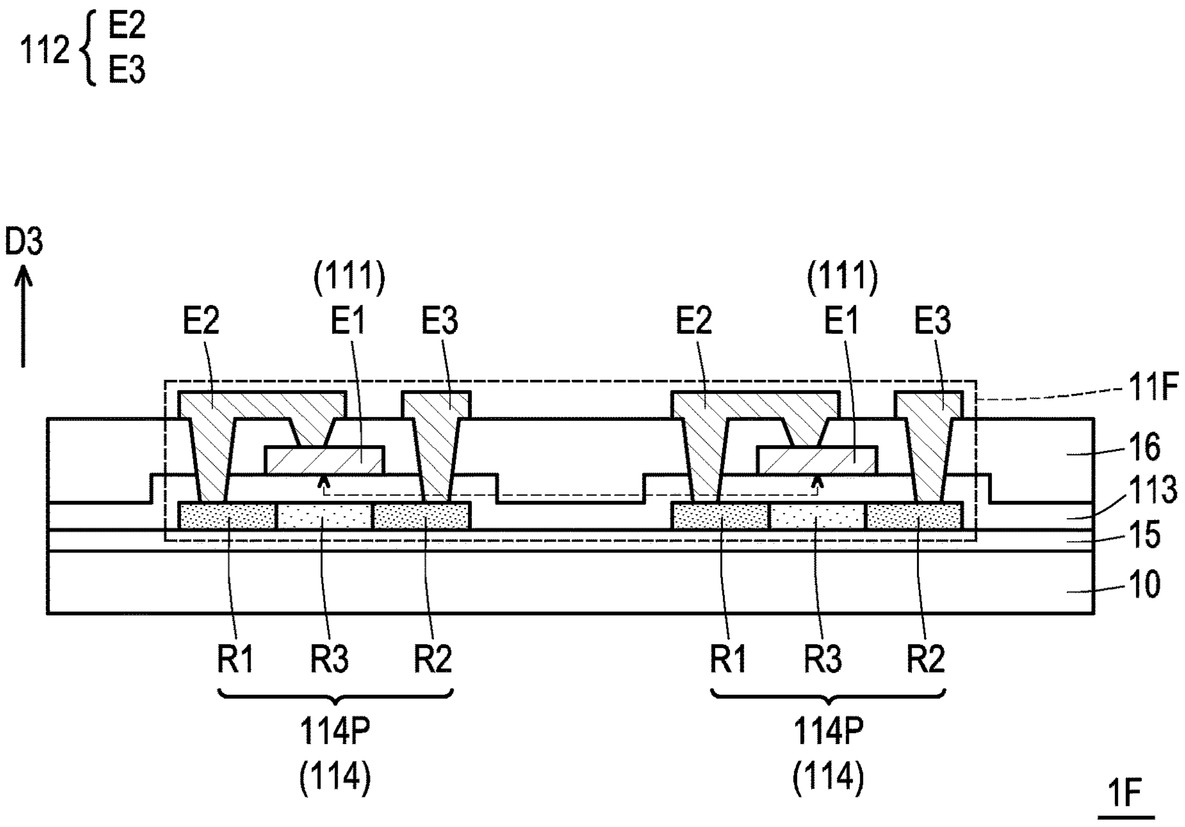
FIG. 14 is a schematic partial cross-sectional view of the electrostatic discharge protection element in FIG. 13.
Figure 15:
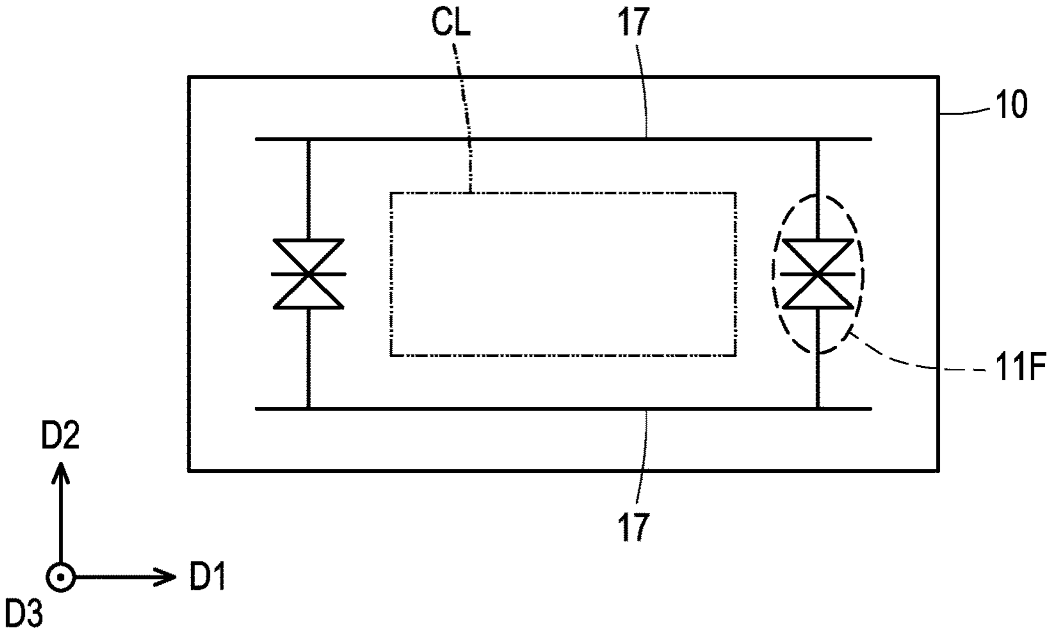
FIG. 15 is a schematic top view illustrating a disposed position of the electrostatic discharge protection element.
Figure 16:
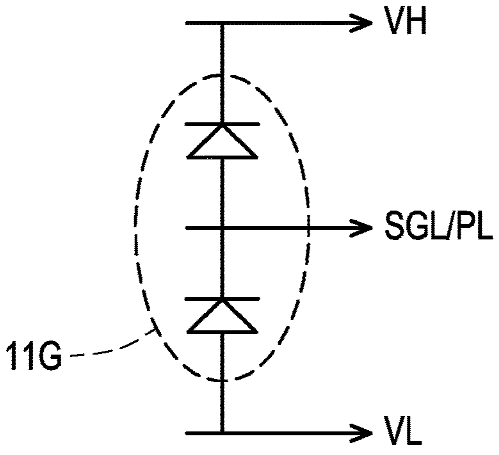
FIG. 16 is a schematic view of a circuit symbol of the electrostatic discharge protection element.
Figure 17:
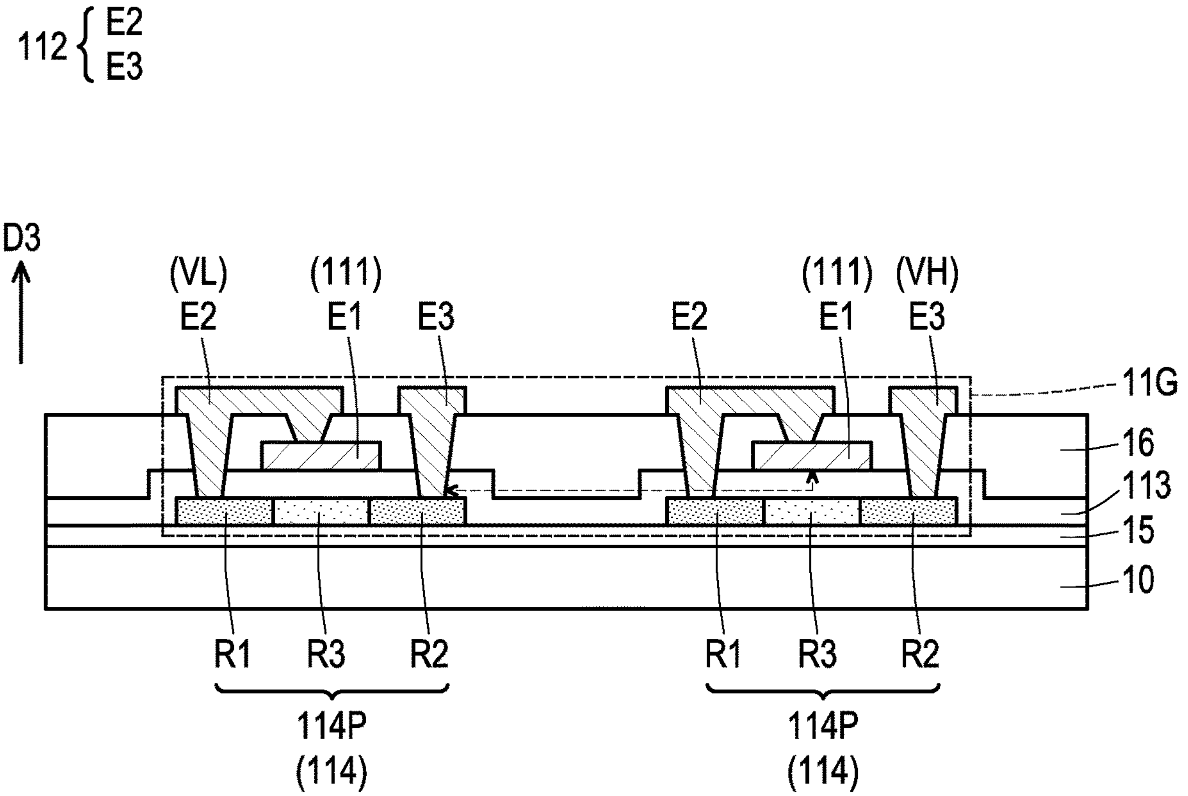
FIG. 17 is a schematic partial cross-sectional view of the electrostatic discharge protection element shown in FIG. 16.

FIG. 1A and FIG. 1B are schematic top views of a modulation device of an embodiment according to the disclosure before and after completion. FIG. 2 is a schematic top view showing various disposed positions of an electrostatic discharge protection element. FIG. 3 to FIG. 10 are a plurality of schematic top views, respectively illustrating various implementations of the electrostatic discharge protection element. FIG. 11 and FIG. 12 are a plurality of schematic top views, respectively illustrating two relative disposed relationships between the electrostatic discharge protection element and an active region. FIG. 13 is a schematic top view of a modulation device according to another embodiment of disclosure. FIG. 14 is a schematic partial cross-sectional view of the electrostatic discharge protection element in FIG. 13. FIG. 15 is a schematic top view illustrating a disposed position of the electrostatic discharge protection element. FIG. 16 is a schematic view of a circuit symbol of the electrostatic discharge protection element. FIG. 17 is a schematic partial cross-sectional view of the electrostatic discharge protection element shown in FIG. 16.

Please refer to FIG. 1B first. A modulation device 1 may include a substrate 10, an electrostatic discharge protection element 11, an electronic element 12, and a driving element (such as a driving element 13 and a driving element 14). The substrate 10 has an active region RA. The electrostatic discharge protection element 11 is arranged around the active region RA. The electronic element 12 disposed in the active region RA. The driving element (such as the driving element 13 and the driving element 14) is electrically connected to the electronic element 12.

Specifically, the substrate 10 may be a rigid substrate or a flexible substrate. The material of the substrate 10 includes, for example, glass, quartz, ceramics, sapphire, or plastic, but is not limited thereto. The plastic may include polycarbonate (PC), polyimide (PI), polypropylene (PP), polyethylene terephthalate (PET), other suitable flexible materials, or a combination of the above-mentioned materials, but not limited thereto. In addition, the transmittance of the substrate 10 is not limited, that is, the substrate 10 may be a transparent substrate, a semi-transparent substrate, or a nontransparent substrate.

The active region RA of the substrate 10 may be configured to dispose the electronic element 12. In some embodiments, the modulation device 1 may include a plurality of electronic elements 12. The plurality of electronic elements 12 may be arranged in an array in the active region RA. The plurality of electronic elements 12 may include passive elements, active elements, or combinations thereof, such as capacitors, resistors, inductors, diodes, transistors, but not limited thereto. The diodes may include light emitting diodes, photodiodes, or varactor diodes. The light emitting diodes may, for example, include organic light emitting diodes, submillimeter light emitting diodes, micro light emitting diodes, or quantum dot light emitting diodes, but are not limited thereto.

In addition to the active region RA, the substrate 10 may also have a peripheral region RP. The peripheral region RP may be disposed on one or more sides of the active region RA. In some embodiments, as shown in FIG. 1B, the peripheral region RP may surround the active region RA. For ease of identification, FIG. 1B marks a boundary B between the active region RA and the peripheral region RP with a thin dotted line.

The peripheral region RP of the substrate 10 may be configured to dispose a driving element, such as the driving element 13 and the driving element 14. In some embodiments, as shown in FIG. 1B, the driving element 13 may be a gate driving element, and the driving element 13 may be electrically connected to the plurality of electronic elements 12 through a plurality of first signal lines (such as gate lines) GL. Specifically, the plurality of first signal lines GL may extend from the active region RA of the substrate 10 to the peripheral region RP, so as to electrically connect the plurality of electronic elements 12 and the driving element 13. In addition, the driving element 14 may be a source driving element, and the driving element 14 may be electrically connected to the plurality of electronic elements 12 through a plurality of second signal lines (such as source lines) DL. Specifically, the plurality of second signal lines DL may extend from the active region RA of the substrate 10 to the peripheral region RP, so as to electrically connect the plurality of electronic elements 12 and the driving element 14. For ease of identification, FIG. 1B shows the plurality of first signal lines GL in thick solid lines and shows the plurality of second signal lines DL in thin solid lines.

Viewed from a top view, the plurality of first signal lines GL and the plurality of second signal lines DL intersect with each other and may be electrically insulated from each other, for example, through an insulation layer (not shown). For example, the plurality of first signal lines GL and the plurality of second signal lines DL may belong to two different conductive layers respectively, and the two conductive layers may be disposed with an insulation layer (not shown), so that the plurality of first signal lines GL and the plurality of second signal lines DL maintain independent electrical properties respectively.

The peripheral region RP of the substrate 10 may also be configured to dispose the electrostatic discharge protection element 11. The electrostatic discharge protection element 11 may be configured to reduce the damage to the electronic element 12 caused by electro static discharge (ESD) during the manufacturing of the modulation device 1 and even in the subsequent transportation process. As shown in FIG. 1A, the electrostatic discharge protection element 11 may include a frame-shaped conductive pattern 110, and the frame-shaped conductive pattern 110 may surround the active region RA. Before disposing the driving element 13 and the driving element 14, the frame-shaped conductive pattern 110 may be a plurality of conductive patterns 110P (refer to FIG. 1B) that are continuous and not broken as arranged with spacings, and the frame-shaped conductive pattern 110 may be electrically connected to the plurality of first signal lines GL and the plurality of second signal lines DL to reduce the damage to the electronic element 12 caused by the ESD.

The frame-shaped conductive pattern 110 may be directly connected or indirectly connected to the plurality of first signal lines GL and the plurality of second signal lines DL through conductive vias (not shown). In some embodiments, the plurality of first signal lines GL, the plurality of second signal lines DL, and the frame-shaped conductive pattern 110 may belong to three different conductive layers respectively, and the insulation layer (not shown) may be disposed between any two conductive layers. For example, the plurality of first signal lines GL may belong to a first patterned conductive layer, the plurality of second signal lines DL may belong to a second patterned conductive layer, and the frame-shaped conductive pattern 110 may belong to a third patterned conductive layer, in which a first insulation layer between the first patterned conductive layer and the second patterned conductive layer, and a second insulation layer is between the second patterned conductive layer and the third patterned conductive layer. Under this structure, the plurality of first signal lines GL may be electrically connected to the frame-shaped conductive pattern 110 through a plurality of conductive vias (not shown) running through the first insulation layer and the second insulation layer, and the plurality of second signal lines DL may be electrically connected to the frame-shaped conductive pattern 110 through the plurality of conductive vias (not shown) running through the second insulation layer.

In other embodiments, the frame-shaped conductive pattern 110 may be divided into a plurality of portions P1 extending in a first direction D1 and a plurality of portions P2 extending in a second direction D2, in which the plurality of portions P1 extending in the first direction D1 and the plurality of first signal lines GL may belong to the same conductive layer (such as the first patterned conductive layer), and the plurality of portions P2 extending in the second direction D2 and the plurality of second signal lines DL may belong to the same conductive layer (such as the second patterned conductive layer), and the plurality of portions P1 and the plurality of portions P2 may be electrically connected to each other through the plurality of conductive vias running through the first insulation layer. Under this architecture, the plurality of first signal lines GL may be electrically connected to at least one of the portions P2 through the plurality of conductive vias running through the first insulation layer, and the plurality of second signal lines DL may be electrically connected to at least one of the portions P1 through the plurality of conductive vias running through the first insulation layer.

In still some embodiments, the frame-shaped conductive pattern 110 may be divided into the plurality of portions P1 extending in the first direction D1 and the plurality of portions P2 extending in the second direction D2, in which the plurality of portions P1 extending in the first direction D1 may belong to the same conductive layer (such as the second patterned conductive layer) with the plurality of second signal lines DL, and the plurality of portions P2 extending in the second direction D2 may belong to the same conductive layer (such as the first patterned conductive layer) with the plurality of first signal lines GL, and the plurality of portions P1 and the plurality of portions P2 may be electrically connected to each other through the plurality of conductive vias running through the first insulation layer. Under this architecture, the plurality of first signal lines GL may be directly connected to the at least one portion P2, and the plurality of second signal lines DL may be directly connected to the at least one portion P1.

On the other hand, after disposing the driving element 13 and the driving element 14, as shown in FIG. 1B, the frame-shaped conductive pattern 110 may be formed by arranging the plurality of conductive patterns 110P with spacings. Specifically, the frame-shaped conductive pattern 110 may be broken into the plurality of conductive patterns 110P separated from each other by laser, etching, or other patterning processes, in which each of the first signal lines GL is electrically connected to the corresponding conductive pattern 110P, and each of the second signal lines DL is electrically connected to the corresponding conductive pattern 110P, so as to independently control each signal line (including the plurality of first signal lines GL and the plurality of second signal lines DL) or avoid short circuit between signal lines. It should be understood that, the spacings between the plurality of conductive patterns 110P or the length of each of the conductive patterns 110P may be changed according to actual requirements, and is not limited to as shown in FIG. 1B.

In this embodiment, the conductive layer and the insulation layer, etc. (such as the plurality of first signal lines GL, the plurality of second signal lines DL, the electrostatic discharge protection element 11, and the insulation layer disposed between the plurality of patterned conductive layers) are, for example, directly formed on the substrate 10, while the semiconductor layer or the semiconductor material is indirectly formed on the substrate 10. For example, an element comprising a semiconductor layer or a semiconductor material is disposed on the substrate through, for example, a bonding process. Taking FIG. 1B as an example, if the electronic element 12 is a transistor or a diode comprising the semiconductor layer, and the driving element 13 and the driving element 14 are chips comprising the semiconductor material, then the plurality of electronic elements 12, the driving element 13, and the driving element 14 are disposed on the substrate 10 through, for example, the bonding process, instead of being directly formed on the substrate 10. The bonding process may include wire bonding, flip chip bonding, chip on board bonding, or other possible bonding processes. In other embodiments, when the electronic element 12 is a capacitor element comprising a plurality of conductive layers and at least one insulation layer alternately stacked, the plurality of electronic elements 12 are, for example, directly formed on the substrate 10.

Referring to FIG. 2, in some embodiments, the substrate 10 may include the plurality of active regions RA, and an electronic element array (not shown) may be formed in each of the active regions RA. In order to reduce the damage to the electronic element (not shown) by the ESD, various electrostatic discharge protection elements may be disposed on the substrate 10, such as the electrostatic discharge protection element 11, an electrostatic discharge protection element 11A, and an electrostatic discharge protection element 11B, but not limited thereto.

The electrostatic discharge protection element 11, for example, surrounds the single active region RA and is positioned between the active region RA and a cutting lane CL. The cutting lane CL is the path of the tool or laser cutting during the subsequent singulation process, and the substrate 10 may be divided into a plurality of units U as shown in FIG. 1A after the singulation process. Next, a patterning process may be performed on the frame-shaped conductive pattern 110 in each of the units U to form the plurality of conductive patterns 110P as shown in FIG. 1B, and the driving element 13 and the driving element 14 are disposed, so as to form the modulation device 1 as shown in FIG. 1A.

The electrostatic discharge protection element 11A, for example, surrounds the plurality of cutting lanes CL and is positioned between the electrostatic discharge protection element 11 and the electrostatic discharge protection element 11B. The electrostatic discharge protection element 11B, for example, surrounds the plurality of electrostatic discharge protection elements 11A and is positioned between the electrostatic discharge protection element 11A and the edge of the substrate 10. In this way, the electrostatic discharge protection element 11A and the electrostatic discharge protection element 11B are removed along with the singulation process (cutting the substrate 10 along the cutting lane CL), so that in the units U divided by the singulation process, the electrostatic discharge protection element 11A and the electrostatic discharge protection element 11B are not seen. According to different requirements, one or several of the electrostatic discharge protection element 11, the electrostatic discharge protection element 11A, and the electrostatic discharge protection element 11B may be omitted.

FIG. 3 to FIG. 10 respectively illustrate various implementations of the electrostatic discharge protection element. Any one of the electrostatic discharge protection element 11, the electrostatic discharge protection element 11A, and the electrostatic discharge protection element 11B in FIG. 2 may be changed according to the implementations in FIG. 3 to FIG. 10.

Figure 3:
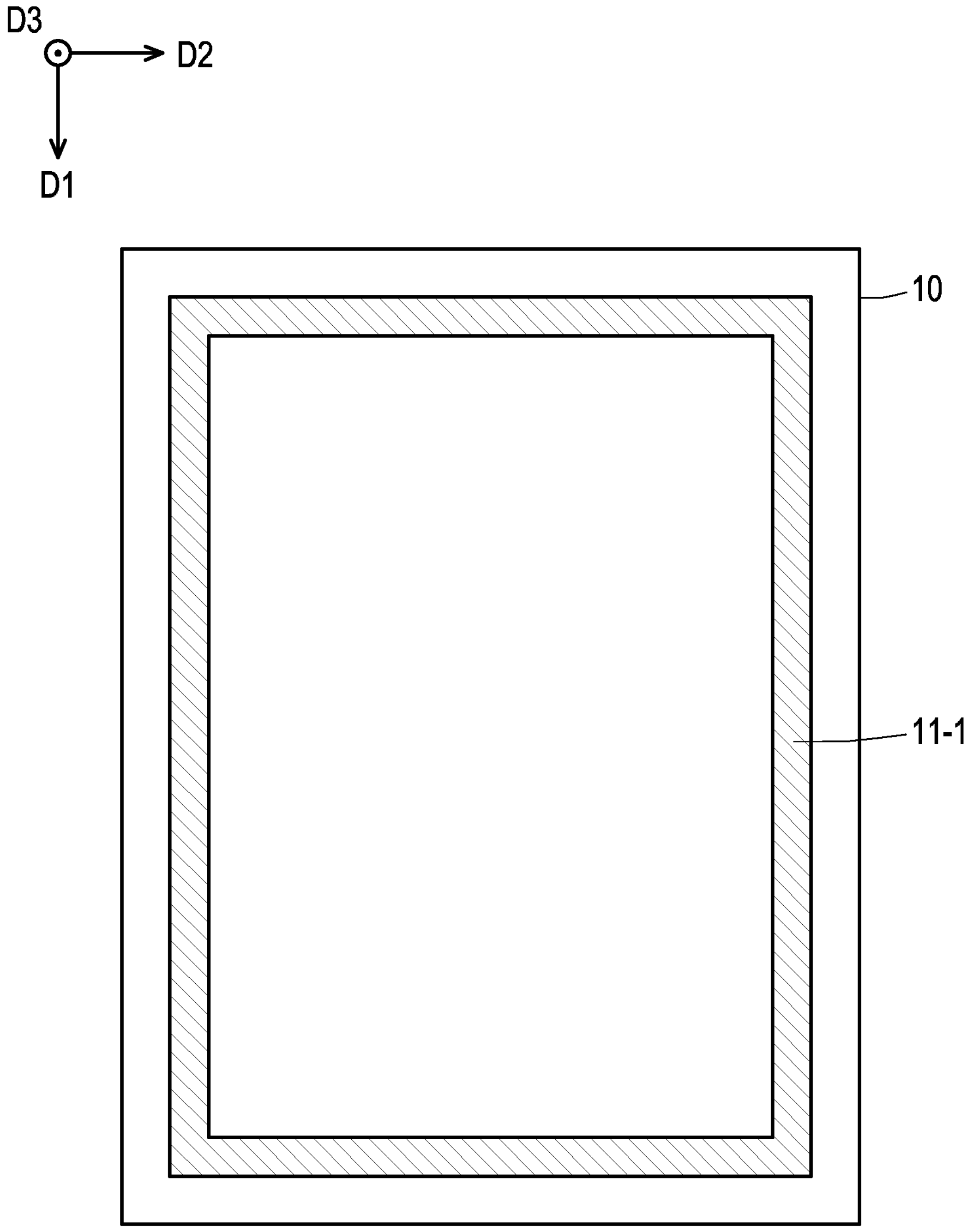
FIG. 3 to FIG. 10 are a plurality of schematic top views, respectively illustrating various implementations of the electrostatic discharge protection element.

In some embodiments, as shown in FIG. 3, the electrostatic discharge protection element may include a first frame-shaped conductive pattern 11-1. The first frame-shaped conductive pattern 11-1 may be formed by a single conductive layer. The material of the conductive layer may include metal or alloy, but is not limited thereto.

Figure 4:
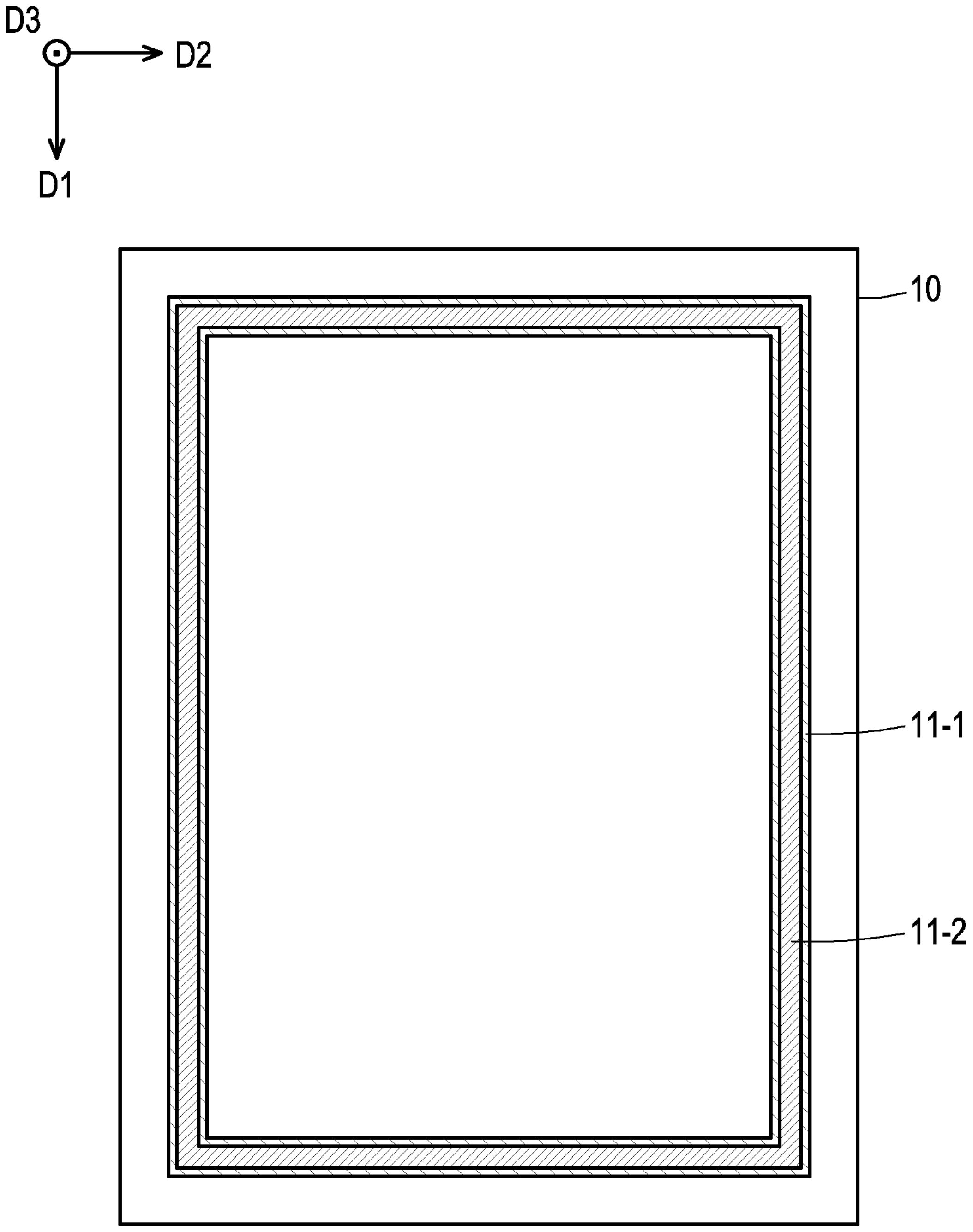

In some embodiments, as shown in FIG. 4, in addition to the first frame-shaped conductive pattern 11-1, the electrostatic discharge protection element may also include a second frame-shaped conductive pattern 11-2, and the second frame-shaped conductive pattern 11-2 overlaps with the first frame-shaped conductive pattern 11-1, for example, the second frame-shaped conductive pattern 11-2 overlaps at least partially with the first frame-shaped conductive pattern 11-1 in a third direction D3. For ease of identification, it is schematically shown in FIG. 4 that the line width of the second frame-shaped conductive pattern 11-2 is smaller than the line width of the first frame-shaped conductive pattern 11-1. However, the disclosure is not limited thereto. The line width of the second frame-shaped conductive pattern 11-2 may be equal to or greater than the line width of the first frame-shaped conductive pattern 11-1.

The first frame-shaped conductive pattern 11-1 and the second frame-shaped conductive pattern 11-2 may be formed by two conductive layers respectively, and the two conductive layers may be separated by an insulation layer (not shown). The material of the two conductive layers may include metal, alloy, or a combination of the above, but not limited thereto. In addition, the material of the two conductive layers may be the same or different. In some embodiments, the first frame-shaped conductive pattern 11-1 and the second frame-shaped conductive pattern 11-2 may be electrically connected through the conductive via running through the insulation layer. Through electrically connecting the two conductive layers, the two conductive layers have the same electric potentials, which can improve the problem of discharging from the side with the high electric potential to the side with the low electric potential due to the difference in electric potential.

Figure 5:
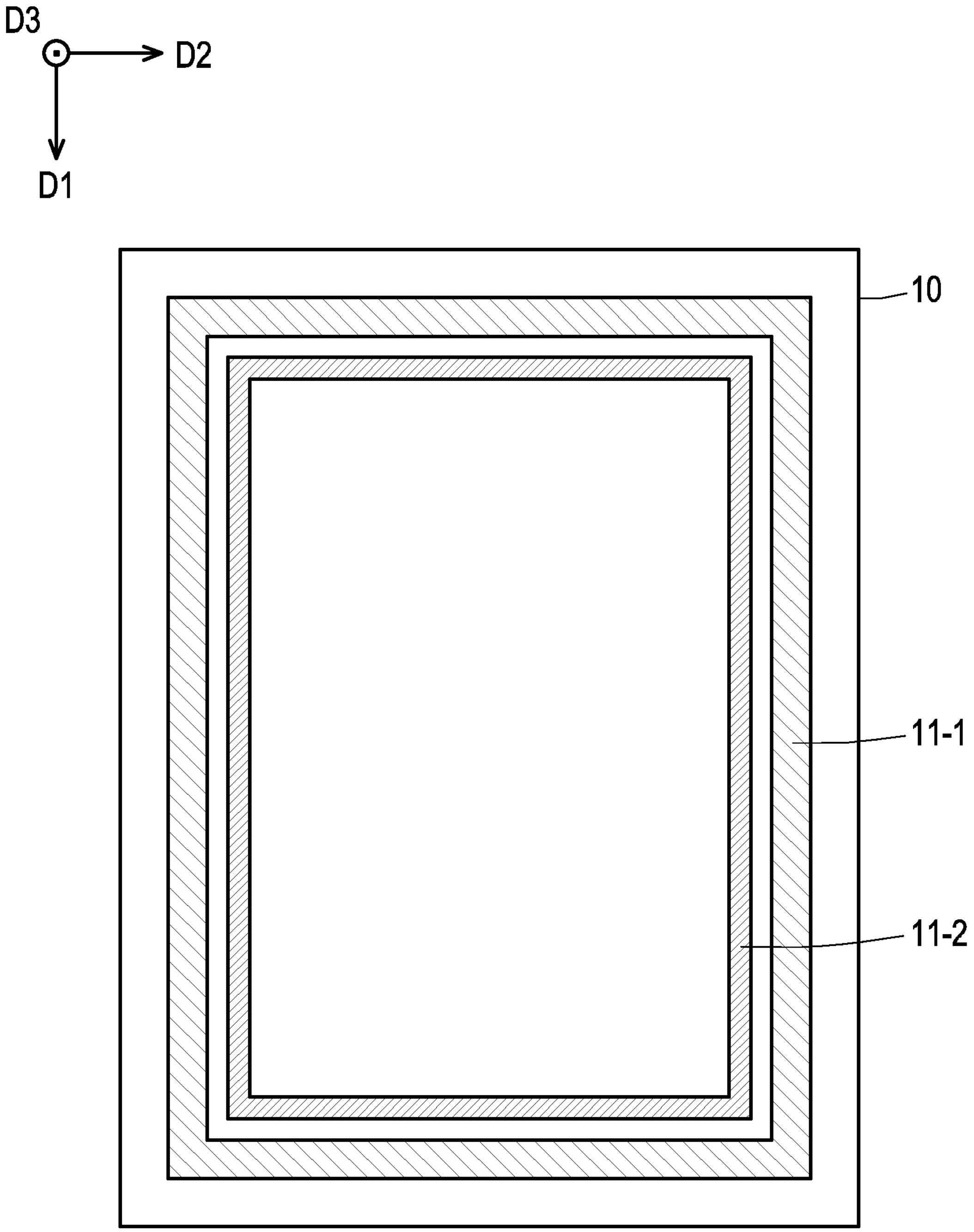

In some embodiments, as shown in FIG. 5, in addition to the first frame-shaped conductive pattern 11-1, the electrostatic discharge protection element may also include the second frame-shaped conductive pattern 11-2, in which the second frame-shaped conductive pattern 11-2 surrounds the active region (not shown in FIG. 5, may refer to FIG. 2) and is positioned between the first frame-shaped conductive pattern 11-1 and the active region. For ease of identification, it is schematically shown in FIG. 5 that the line width of the second frame-shaped conductive pattern 11-2 is smaller than the line width of the first frame-shaped conductive pattern 11-1. However, the disclosure is not limited thereto. The line width of the second frame-shaped conductive pattern 11-2 may be equal to or greater than the line width of the first frame-shaped conductive pattern 11-1.

The first frame-shaped conductive pattern 11-1 and the second frame-shaped conductive pattern 11-2 may be formed by a single conductive layer or formed by two conductive layers respectively. If being formed by the two conductive layers, the material of the two conductive layers may be the same or different.

Figure 6:
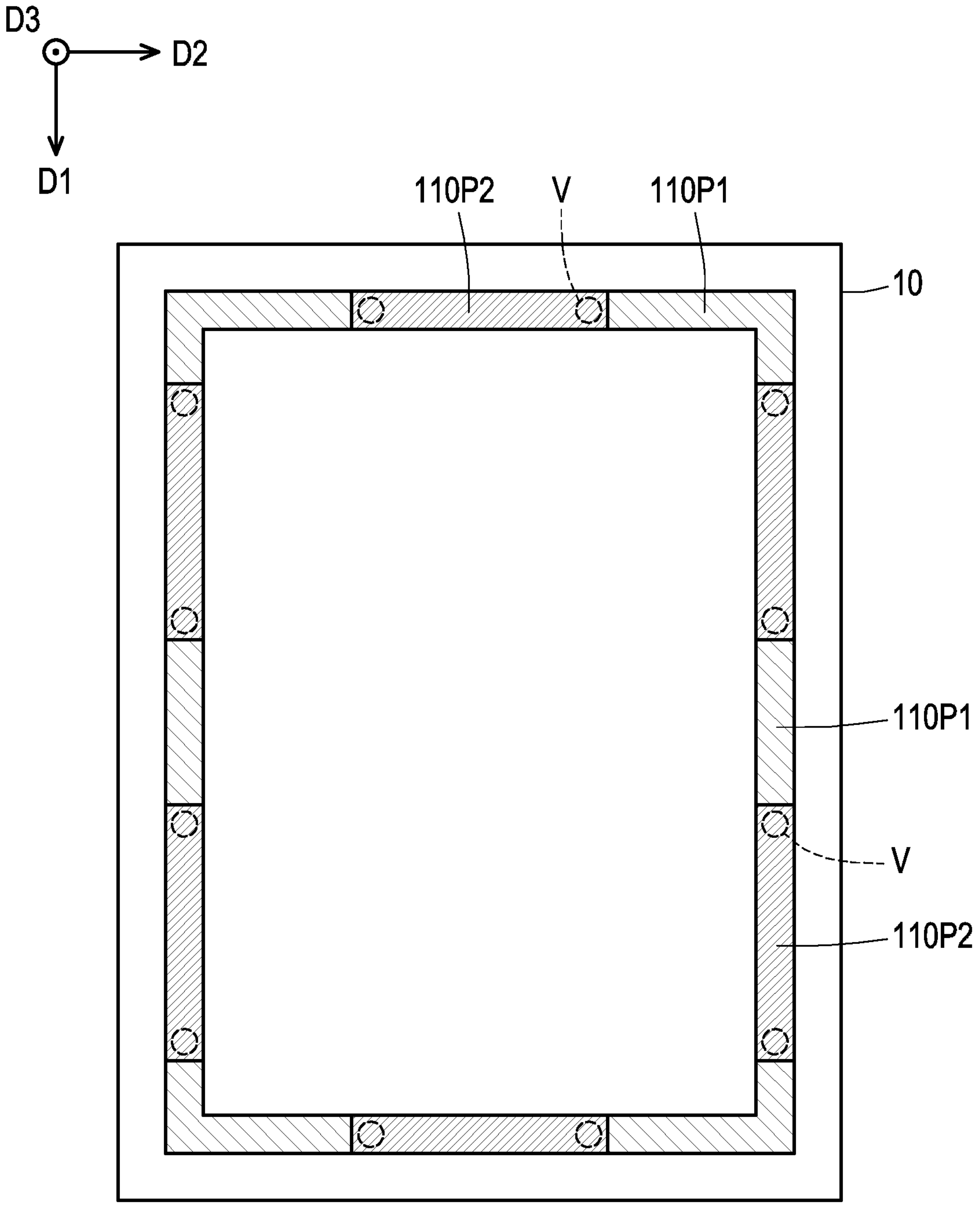

In some embodiments, as shown in FIG. 6, the electrostatic discharge protection element may include a plurality of first conductive patterns HOPI, a plurality of second conductive patterns 110P2, and a plurality of conductive vias V, in which the plurality of first conductive patterns 110P1 and the plurality of second conductive patterns 110P2 surround alternately to form a frame-shaped pattern surrounding the active region (not shown in FIG. 6, may refer to FIG. 2), and the plurality of first conductive patterns 110P1 and the plurality of second conductive patterns 110P2 are electrically connected to each other through the plurality of conductive vias V. It is schematically shown in FIG. 6 that the line width of the second conductive pattern 110P2 is equal to the line width of the first conductive pattern 110P1. However, the disclosure is not limited thereto. The line width of the second conductive pattern 110P2 may be smaller or larger than the line width of the first conductive pattern 110P1.

The plurality of first conductive patterns 110P1 and the plurality of second conductive patterns 110P2 may be formed by two conductive layers respectively, and the two conductive layers may be separated by an insulation layer (not shown). The material of the two conductive layers may include metal, alloy, or a combination of the above, but not limited thereto. In addition, the material of the two conductive layers may be the same or different. In some embodiments, the plurality of first conductive patterns 110P1 and the plurality of second conductive patterns 110P2 may be electrically connected through the conductive vias V running through the insulation layer. Through electrically connecting the two conductive layers, the two conductive layers have the same electric potentials, which can improve the problem of discharging from the side with the high electric potential to the side with the low electric potential due to the difference in electric potential.

Figure 7:
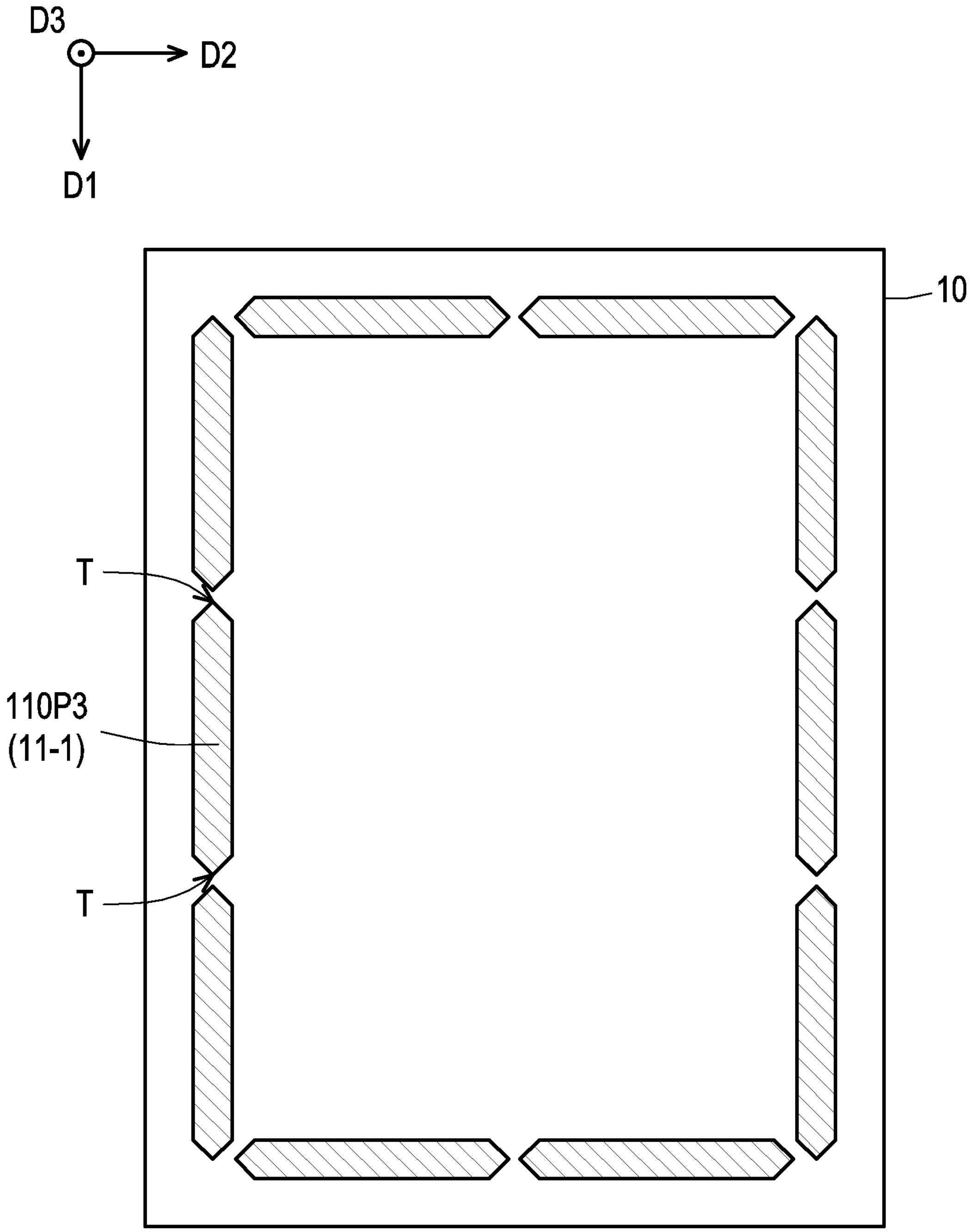

In some embodiments, as shown in FIG. 7, the first frame-shaped conductive pattern 11-1 may be formed by arranging a plurality of conductive patterns 110P3 with spacings, and each of the plurality of conductive patterns 110P3 has two opposite pointed terminals T. By disposing the pointed terminals T of the two adjacent conductive patterns 110P3 opposite to each other, it is helpful for the tip to discharge and release the accumulated charge, thereby reducing the damage to the electronic element (not shown in FIG. 7) caused by the ESD.

Figure 8:
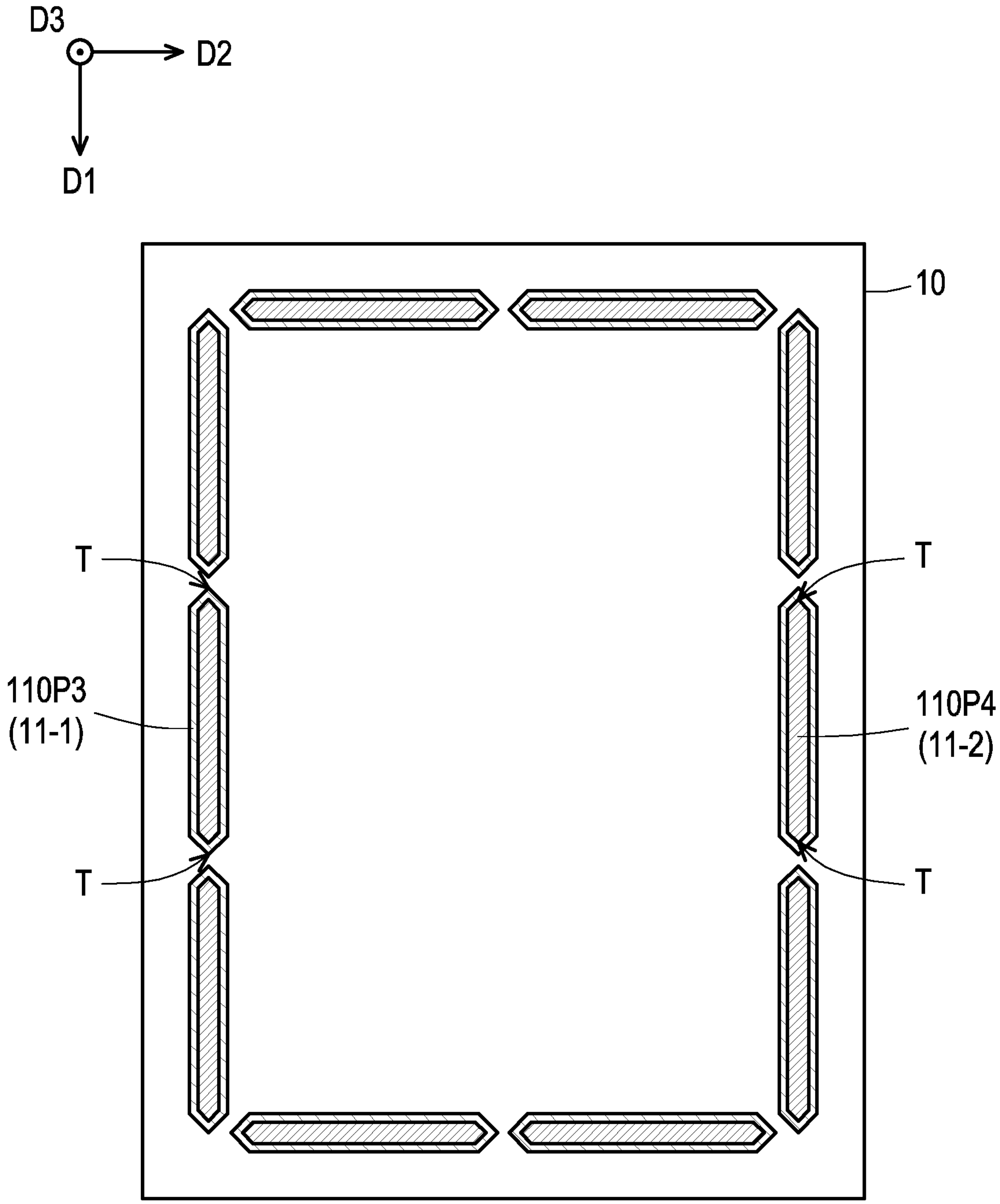

In some embodiments, as shown in FIG. 8, each of the first frame-shaped conductive pattern 11-1 and the second frame-shaped conductive pattern 11-2 may be formed by arranging a plurality of conductive patterns (such as the plurality of conductive patterns 110P3 and a plurality of conductive patterns 110P4) with spacings, each of the plurality of conductive patterns (such as the plurality of conductive patterns 110P3 and the plurality of conductive patterns 110P4) has the two opposite pointed terminals T, and the plurality of conductive patterns 110P4 of the second frame-shaped conductive pattern 11-2 overlap the plurality of conductive patterns 110P3 of the first frame-shaped conductive pattern 11-1 respectively.

Figure 9:
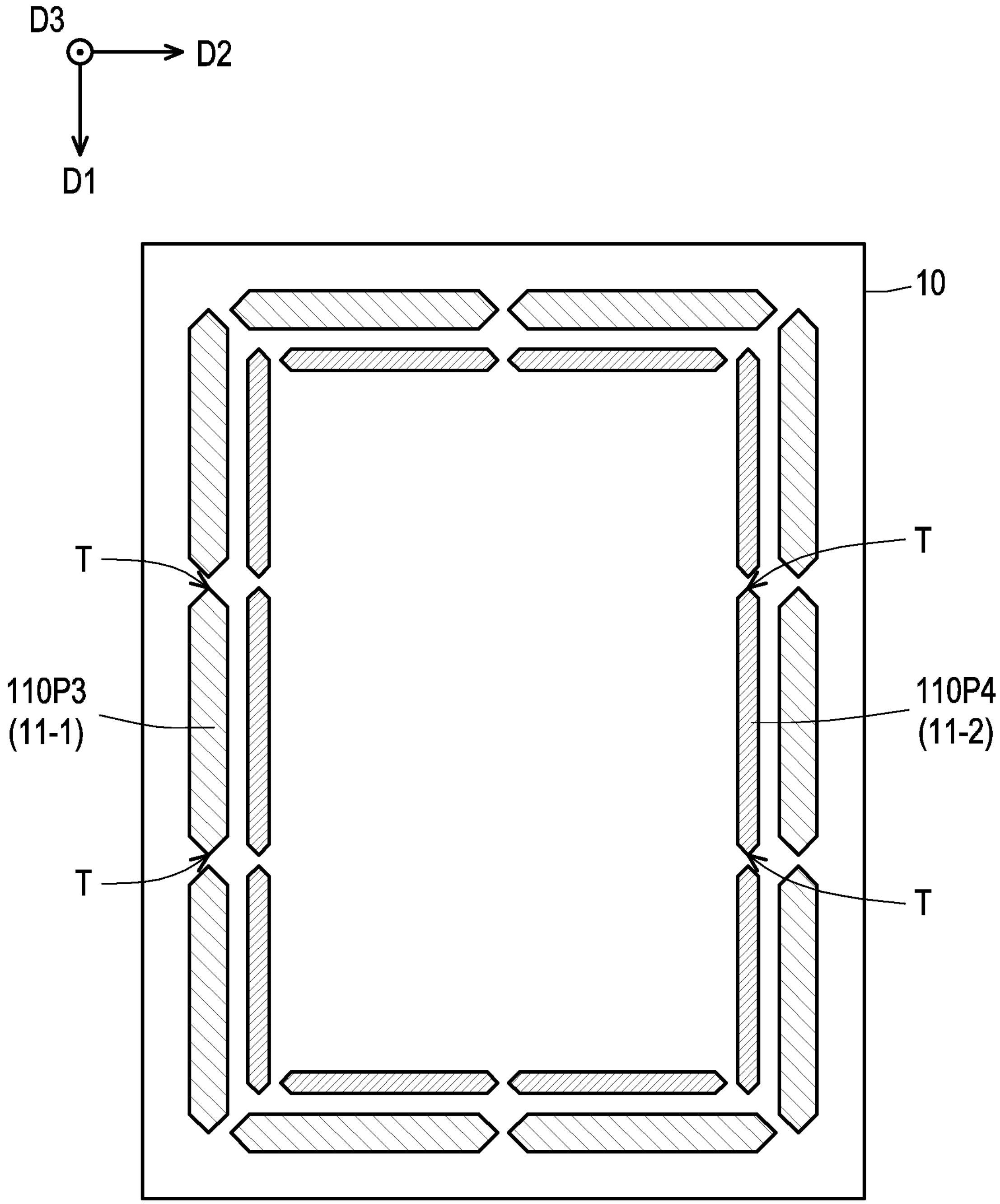
Figure 10:
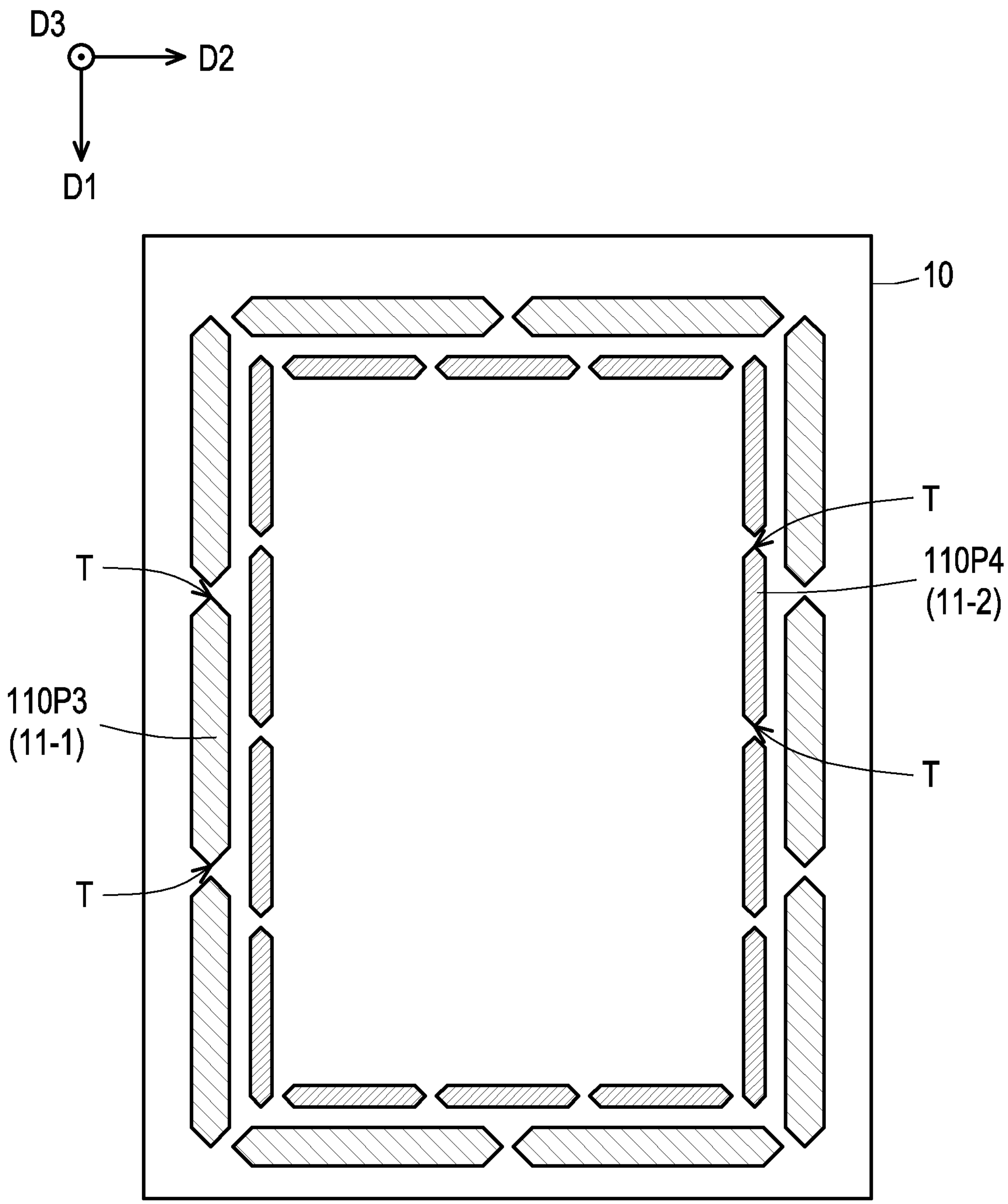

In some embodiments, as shown in FIG. 9 and FIG. 10, the second frame-shaped conductive pattern 11-2 may surround the active region (not shown in FIG. 9, may refer to FIG. 2) and be positioned between the first frame-shaped conductive pattern 11-1 and the active region, in which each of the first frame-shaped conductive pattern 11-1 and the second frame-shaped conductive pattern 11-2 may be formed by arranging a plurality of conductive patterns (such as the plurality of conductive patterns 110P3 and the plurality of conductive patterns 110P4) with spacings, and each of the plurality of conductive patterns (such as the plurality of conductive patterns 110P3 and the plurality of conductive patterns 110P4) has the two opposite pointed terminals T. The plurality of conductive patterns 110P3 and the plurality of conductive patterns 110P4 may be arranged in parallel (as shown in FIG. 9) or in a staggered manner (as shown in FIG. 10).

Although the electrostatic discharge protection element of the embodiment is illustrated with the frame-shaped conductive pattern, the disclosure is not limited thereto. As shown in FIG. 11, the electrostatic discharge protection element (such as an electrostatic discharge protection element 11C and an electrostatic discharge protection element 11D) may be a shorting bar.

The plurality of first signal lines GL are electrically connected by using the electrostatic discharge protection element 11C, and the plurality of second signal lines DL are electrically connected by using the electrostatic discharge protection element 11D, which can provide electrostatic discharge protection (such as venting the accumulated charge) before cutting the substrate 10 along the cutting lane CL and before disposing the driving element 13 and the driving element 14 on the substrate 10, so as to reduce the damage to the electronic element 12 caused by the ESD.

In some embodiments, the electrostatic discharge protection element 11C and the plurality of first signal lines GL may belong to the same patterned conductive layer (such as the first patterned conductive layer), and the electrostatic discharge protection element 11D and the plurality of second signal lines DL may belong to the same patterned metal layer (such as the second patterned conductive layer) to simplify the manufacturing process.

In some embodiments, as shown in FIG. 11, the electrostatic discharge protection element 11C and the electrostatic discharge protection element 11D may be disposed outside the cutting lane CL. Under this architecture, the plurality of first signal lines GL extend through the a region disposed with the driving element 13 and an edge of the cutting lane CL to be electrically connected to the electrostatic discharge protection element 11C, and the plurality of second signal lines DL extend through a region disposed with the driving element 14 and an edge of the cutting lane CL to be electrically connected to the electrostatic discharge protection element 11D. The electrostatic discharge protection element 11C and the electrostatic discharge protection element 11D are removed along with the singulation process (cutting the substrate 10 along the cutting lane CL), which helps reduce the area of the peripheral region RP. In addition, at least one terminal of each of the first signal lines GL is aligned with at least one edge of the substrate 10 after being cut, and at least one terminal of each of the second signal lines DL is aligned with at least another one edge of the substrate 10 after being cut.

In some embodiments, as shown in FIG. 12, an electrostatic discharge protection element 11E may surround the cutting lane CL, in which the electrostatic discharge protection element 11E may not be in the same layer as the plurality of first signal lines GL and the plurality of second signal lines DL. For example, the electrostatic discharge protection element 11E may belong to a third patterned conductive layer, and the electrostatic discharge protection element 11E may be electrically connected to the plurality of first signal lines GL and the plurality of second signal lines DL through the conductive vias (not shown).

The plurality of first signal lines GL and the plurality of second signal lines DL are electrically connected by using the electrostatic discharge protection element 11E, which can provide electrostatic discharge protection (such as venting the accumulated charge) before cutting the substrate 10 along the cutting lane CL and before disposing the driving element 13 and the driving element 14 on the substrate 10, so as to reduce the damage to the electronic element 12 caused by the ESD. The electrostatic discharge protection element 11E is removed along with the singulation process (cutting the substrate 10 along the cutting lane CL), which helps reduce the area of the peripheral region RP. In addition, at least one terminal of each of the first signal lines GL is aligned with at least one edge of the substrate 10 after being cut, and at least one terminal of each of the second signal lines DL is aligned with at least another one edge of the substrate 10 after being cut.

Please refer to FIG. 13 and FIG. 14, a modulation device 1F may include the substrate 10, an electrostatic discharge protection element 11F, and the electronic element 12. The substrate 10 has the active region RA. The electrostatic discharge protection element 11F is disposed on the substrate 10 and includes a first conductive layer 111, a second conductive layer 112, an insulation layer 113, and a semiconductor layer 114. The electronic element 12 disposed in the active region RA.

In detail, in this embodiment, the electrostatic discharge protection element 11F, for example, uses a diode as electrostatic discharge protection, in which the modulation device 1F may include the plurality of electrostatic discharge protection elements 11F, and the plurality of electrostatic discharge protection element 11F may surround the active region RA to protect the plurality of electronic elements 12 positioned in the active region RA. In addition, the semiconductor layer 114 in the electrostatic discharge protection element 11F is, for example, directly formed (e.g., deposited) on the substrate 10. In some embodiments, as shown in FIG. 14, the semiconductor layer 114, the insulation layer 113, the first conductive layer 111, and the second conductive layer 112 may be disposed on the substrate 10 sequentially. In addition, the modulation device 1F may also include a buffer layer 15 disposed between the substrate 10 and the semiconductor layer 114 and an insulation layer 16 disposed between the first conductive layer 111 and the second conductive layer 112, but not limited thereto. It should be understood that FIG. 14 only schematically shows one of the stacked structures of the electrostatic discharge protection element 11F, but the stacked structure of the electrostatic discharge protection element 11F may be changed according to actual requirements, and the modulation device 1F may be increased or decreased by one or multiple film layers according to actual requirements.

In detail, the buffer layer 15 is disposed on the substrate 10. The material of the buffer layer 15 may include inorganic material, such as silicon oxide, silicon nitride, or a combination thereof, but not limited thereto.

The semiconductor layer 114 is disposed on the buffer layer 15. The material of the semiconductor layer 114 may include oxide semiconductor material, such as Indium Gallium Zinc Oxide (IGZO), but not limited thereto. In other embodiments, the material of the semiconductor layer 114 may include amorphous silicon, polysilicon, or metal oxide. The semiconductor layer 114 is, for example, a patterned semiconductor layer and may include a plurality of semiconductor patterns 114P. Each of the semiconductor patterns 114P may include a first region R1, a second region R2, and a third region R3, in which the third region R3 is positioned between the first region R1 and the second region R2.

The insulation layer 113 is disposed on the buffer layer 15 and the semiconductor layer 114. The material of the insulation layer 113 may include inorganic material, such as silicon oxide, silicon nitride, or a combination thereof, but not limited thereto.

The first conductive layer 111 is disposed on the insulation layer 113. The material of the first conductive layer 111 may include metal or metal stacks, such as aluminum, molybdenum, or titanium/aluminum/titanium, but not limited thereto. The first conductive layer 111 may be a patterned conductive layer, and the first conductive layer 111 may include a plurality of first electrodes E1, the plurality of first signal lines GL (refer to FIG. 13) and other lines (not shown), but not limited thereto. The plurality of first electrodes E1 overlap the plurality of third regions R3 on the third direction D3 respectively.

The insulation layer 16 is disposed on the insulation layer 113 and the first conductive layer 111. The material of the insulation layer 16 may include organic material, inorganic material, or a combination of the above. The organic material includes, for example, PMMA, epoxy, acrylic-based resin, silicone, polyimide polymer, or a combination of the above, but not limited thereto. The inorganic material includes, for example, silicon oxide or silicon nitride, but not limited thereto.

The second conductive layer 112 is disposed on the insulation layer 16. The material of the second conductive layer 112 may include metal or metal stacks, such as aluminum, molybdenum, or titanium/aluminum/titanium, but not limited thereto. The second conductive layer 112 may be a patterned conductive layer, and the second conductive layer 112 may include a plurality of second electrodes E2, a plurality of third electrodes E3, the plurality of second signal lines DL (refer to FIG. 13) and other lines (not shown), but not limited to. Each of the second electrodes E2 may be electrically connected to the corresponding first region R2 through the insulation layer 16 and the insulation layer 113, and each of the second electrodes E2 may also be electrically connected to the corresponding first electrode E1 through the insulation layer 16. In addition, the third electrode E3 may be electrically connected to the corresponding second region R2 through the insulation layer 16 and the insulation layer 113.

Each of the electrostatic discharge protection element 11F includes, for example, two of the semiconductor patterns 114P, two of the first electrodes E1, two of the second electrodes E2, and two of the third electrodes E3, in which the two first electrodes E1 are electrically connected to each other, and the two first electrodes E1 are also electrically connected to the two second electrodes E2 respectively. In some embodiments, one of the two third electrodes E3 may be electrically connected to a signal line (the first signal line GL or the second signal line DL as shown in FIG. 13) or a power cord (not shown). In some embodiments, the other of the two third electrodes E3 may be electrically connected to the ground line (not shown), a common electrode line ML (as shown in FIG. 13), the signal line (the first signal line GL or the second signal line DL as shown in FIG. 13), or the power cord (not shown). For example, when one of the two third electrodes E3 is electrically connected to the signal line or the power cord, the other of the two third electrodes E3 may be electrically connected to the ground line or the common electrode line ML, or the other of the two third electrodes E3 may be electrically connected to another signal line or another power cord.

Since the second electrode E2 is electrically connected to the first electrode E1, by making the electric potential of the third electrode E3 smaller than the electric potential of the first electrode E1, the probability of the electrostatic current flowing from the third electrode E3 to the second electrode E2 can be reduced, thereby reducing the probability that the electrostatic current flowing to the electronic element 12 (refer to FIG. 13) via the signal line or the power cord electrically connected to the second electrode E2, so as to provide the effect of electrostatic discharge protection accordingly.

In some embodiments, as shown in FIG. 15, two of the electrostatic discharge protection elements 11F may be disposed on opposite sides of the cutting lane CL, and the two electrostatic discharge protection elements 11F may be connected in parallel through two conductive wires 17. In some embodiments, the two conductive wires 17 may be floated to provide the effect of electrostatic discharge protection.

In some embodiments, as shown in FIG. 16 and FIG. 17, each electrostatic discharge protection element 11G includes, for example, two of the semiconductor patterns 114P, two of the first electrodes E1, two of the second electrodes E2, and two of the third electrodes E3, in which the two first electrodes E1 are electrically connected to the two second electrodes E2 respectively, and one of the two first electrodes E1 (the first electrode E1 as on the right in FIG. 17) is also electrically connected to one of the two third electrodes E3 (the third electrode E3 as on the left in FIG. 17). In some embodiments, the other of the two first electrodes E1 (the first electrode E1 as on the left in FIG. 17) is electrically connected to a low electric potential VL, one of the two first electrodes E1 (the first electrode E1 as on the right in FIG. 17) is electrically connected to the signal line (the first signal line GL or the second signal line DL as shown in FIG. 13) or the power cord, and the other of the two third electrodes E3 (the third electrode E3 as on the right in FIG. 17, namely the third electrode E3 not electrically connected to the first electrode E1) is electrically connected to a high electric potential VH.

Through the above design, the probability of the electrostatic current flowing from the third electrode E3 to the second electrode E2 can be reduced, thereby reducing the probability that the electrostatic current flowing to the electronic element 12 (refer to FIG. 13) via the signal line or the power cord electrically connected to the second electrode E2 (the second electrode E2 as on the right in FIG. 17), so as to provide the effect of electrostatic discharge protection accordingly.

In summary, in the embodiment of disclosure, through disposing the electrostatic discharge protection element, the damage to the electronic element caused by the ESD is reduced.

The above embodiments are merely used to illustrate the technical solution of the disclosure, not to limit it; although the disclosure has been described in detail with reference to the aforementioned embodiments, persons with ordinary knowledge in the technical field should understand that they can still modify the technical solutions described in the aforementioned embodiments, or perform equivalent replacements for part or all of the technical features. However, these modifications or replacements do not make the essence of the corresponding technical solutions depart from the scope of each technical solution according to the embodiments of the disclosure.

Although the embodiments of the disclosure and advantages thereof have been disclosed above, it should be understood that persons with ordinary knowledge in the technical field may make changes, substitutions, and modifications without departing from the spirit and scope of the disclosure, and the features between the various embodiments may be arbitrarily mixed and replaced to form other new embodiments. In addition, the scope of protection of the disclosure is not limited to the process, machine, manufacturing, material composition, device, method, and operations in the specific embodiments described in the specification. Persons with ordinary knowledge in the technical field may understand the process, machine, manufacturing, material composition, device, method, and operations as in the current or developed in the future according to the embodiments of the disclosure described here, as long as roughly the same function may be performed or roughly the same result may be obtained, the disclosure may be used. Therefore, the protection scope of the disclosure includes the above-mentioned process, machine, manufacturing, material composition, device, method, and operations. In addition, each claim constitutes an individual embodiment, and the protection scope of the disclosure also includes the combination of each claim and embodiment. The scope of protection of the disclosure should be defined by the appended claims.

What is claimed is:

1. A modulation device, comprising:

a substrate having an active region;

an electrostatic discharge protection element arranged around the active region;

an electronic element disposed in the active region;

a driving element electrically connected to the electronic element;

a plurality of first signal lines extending in the active region along a first direction; and a plurality of second signal lines extending in the active region along a second direction different from the first direction, wherein the electrostatic discharge protection element comprises a plurality of conductive patterns, and the plurality of conductive patterns are separated from each other, and at least one of the plurality of conductive patterns is traversed by one of the plurality of first signal lines or is traversed by one of the plurality of second signal lines;

wherein the plurality of first signal lines belong to a first patterned conductive layer, the plurality of second signal lines belong to a second patterned conductive layer, and the plurality of conductive patterns belong to a third patterned conductive layer.

2. The modulation device as claimed in claim 1, wherein the electronic element comprises a capacitor.

3. The modulation device as claimed in claim 1, wherein the electrostatic discharge protection element comprises a first frame-shaped conductive pattern, and the first frame-shaped conductive pattern surrounds the active region.

4. The modulation device as claimed in claim 3, wherein the first frame-shaped conductive pattern is formed by arranging the plurality of conductive patterns with spacings, and each of the plurality of conductive patterns has two opposite pointed terminals.

5. The modulation device as claimed in claim 3, wherein the electrostatic discharge protection element further comprises a second frame-shaped conductive pattern, and the second frame-shaped conductive pattern overlaps with the first frame-shaped conductive pattern.

6. The modulation device as claimed in claim 5, wherein each of the first frame-shaped conductive pattern and the second frame-shaped conductive pattern is formed by arranging the plurality of conductive patterns with spacings, each of the plurality of conductive patterns has two opposite pointed terminals, and the plurality of conductive patterns of the second frame-shaped conductive pattern overlap the plurality of conductive patterns of the first frame-shaped conductive pattern respectively.

7. The modulation device as claimed in claim 3, wherein the electrostatic discharge protection element further comprises a second frame-shaped conductive pattern, wherein the second frame-shaped conductive pattern surrounds the active region and is positioned between the first frame-shaped conductive pattern and the active region.

8. The modulation device as claimed in claim 7, wherein each of the first frame-shaped conductive pattern and the second frame-shaped conductive pattern is formed by arranging the plurality of conductive patterns with spacings, and each of the plurality of conductive patterns has two opposite pointed terminals.

9. The modulation device as claimed in claim 1, wherein the electrostatic discharge protection element comprises a plurality of first conductive patterns, a plurality of second conductive patterns, and a plurality of conductive vias, in which the plurality of first conductive patterns and the plurality of second conductive patterns surround alternately to form a frame-shaped pattern surrounding the active region, and the plurality of first conductive patterns and the plurality of second conductive patterns are electrically connected to each other through the plurality of conductive vias.

10. The modulation device as claimed in claim 1, wherein the electronic element and the driving element are disposed on the substrate through a bonding process.

11. The modulation device as claimed in claim 1, wherein a portion of the plurality of conductive patterns and the plurality of first signal lines belong to the first patterned conductive layer, and another portion of the plurality of conductive patterns and the plurality of second signal lines belong to the second patterned conductive layer.

* * * * *